(12) United States Patent
Viswanadam (10) Patent No.: US 7,998,854 B2
(45) Date of Patent: Aug. 16, 2011

(54) WAFER LEVEL INTEGRATION MODULE WITH INTERCONNECTS

(76) Inventor: Gautham Viswanadam, Singapore (SG)

( * ) Notice: Subject to any disclaimer, the term of this patent is extended or adjusted under 35 U.S.C. 154(b) by 0 days.

(21) Appl. No.: 12/991,545

(22) PCT Filed: May 6, 2009

(86) PCT No.: PCT/SG2009/000164
§ 371 (c)(1),
(2), (4) Date: Nov. 8, 2010

(87) PCT Pub. No.: WO2009/136873
PCT Pub. Date: Nov. 12, 2009

(65) Prior Publication Data
US 2011/0065215 A1 Mar. 17, 2011

(30) Foreign Application Priority Data
May 6, 2008 (SG) .............................. 200803479-5

(51) Int. Cl.
*H01L 21/4763* (2006.01)
(52) U.S. Cl. ................. 438/618; 257/E23.141
(58) Field of Classification Search .................. 438/618, 438/15; 257/E23.001, E23.141, E23.145
See application file for complete search history.

(56) References Cited

U.S. PATENT DOCUMENTS

| | | | |
|---|---|---|---|
| 7,557,014 B2* | 7/2009 | Okamoto et al. | 438/396 |
| 7,799,602 B2* | 9/2010 | Pagaila et al. | 438/106 |
| 2002/0047210 A1 | 4/2002 | Yamada | |
| 2006/0281295 A1* | 12/2006 | Naujok et al. | 438/618 |
| 2009/0081862 A1* | 3/2009 | Chen et al. | 438/618 |
| 2010/0314777 A1* | 12/2010 | Oda | 257/774 |

FOREIGN PATENT DOCUMENTS

| | | |
|---|---|---|
| EP | 238 089 A2 | 9/1987 |
| WO | 03/065 450 A2 | 8/2003 |

OTHER PUBLICATIONS

P.S. Andry, et al; "A CMOS-Compatible Process for Fabricating Electrical Through-vias in Silicon", 2006 Electronic Components and Technology Conference; pp. 831-837; IBM T.J. Watson Research Center; Yorktown Heights, NY IBM Systems and Technology Group; Essex Junction, VT.

* cited by examiner

*Primary Examiner* — Thao P. Le
(74) *Attorney, Agent, or Firm* — Jacobson Holman PLLC (57) ABSTRACT

A method and apparatus for manufacturing an integrated circuit (IC) device (90) is disclosed. A wafer (10) is first provided having a first or top surface and a second or bottom surface. The wafer may be a blank polished or unpolished silicon wafer or the like. High aspect ratio micro-structures (16) that are specifically designed to provide a die level interconnect configuration and mapping, are provided on the first blank surface (12) of the wafer. The wafer with preformed conductive interconnect microstructures (16) are further processed for device fabrication, for example, at the wafer fabrication facilities. Once the front side (12) devices are fabricated, the silicon material (20) is then removed from a second side (14) of the device wafer (10), opposite the first side, to expose the high temperature conductive interconnect microstructures (16). Contacts are formed on the second side of the device wafer using conductive metal. These contacts are electrically connected to the interior of the microstructures and thereby electrically connect with the functional device (26). The dies (90(1)),(90(2)) are separated along the separation zones (88) between the dies to produce individualized functional and packaged dies, each of which serves as a fully packaged IC device (90).

17 Claims, 8 Drawing Sheets

WAFER LEVEL INTEGRATION MODULE WITH INTERCONNECTS

CROSS-REFERENCE TO RELATED APPLICATIONS

The present patent application is a nationalization of International application No. PCT/SG2009/000164, filed May 6, 2009, published in English, which is based on, and claims priority from, Singapore Application No. 200803479-5, filed May 6, 2008, both of which are incorporated herein by reference in their entireties.

FIELD OF THE INVENTION

This invention relates generally to an integrated circuit (IC) device and a method of manufacturing an IC device. More particularly, this invention relates to an IC device including one or more dies arranged in an array configuration within the defined wafer geometry, and to a method of manufacturing such an IC device.

BACKGROUND OF THE INVENTION

With the miniaturization of electronic products, there is a continuous need to reduce the size of devices and to add more functionality so that more IC devices can be accommodated area on a substrate. In prior IC device fabrication, an IC device has a foot print approximately the size of a die of the IC device. Multiple dies with multiple interconnection pads on each die are processed together to form a semiconductor wafer first. The devices that have been arrayed on the wafer are then packaged in many ways. Two such conventional packaging methods include separating the dies from the arrayed wafer prior to packaging, and packaging the arrayed dies on the semiconductor wafer while the arrayed dies are still in wafer form. After packaging, the arrayed dies are then separated, and the IC devices under conventional packaging methods are typically used in the desired application as a wafer level package device.

Figure 1A:
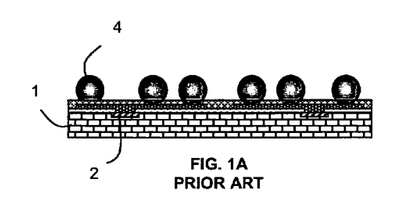
Figure 1B:
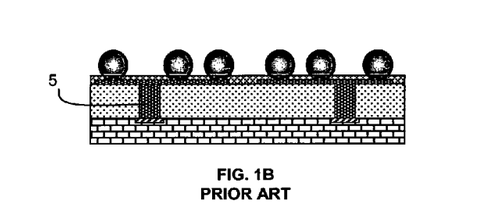
Figure 1C:
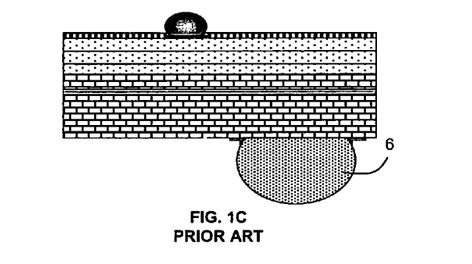
Figure 1D:
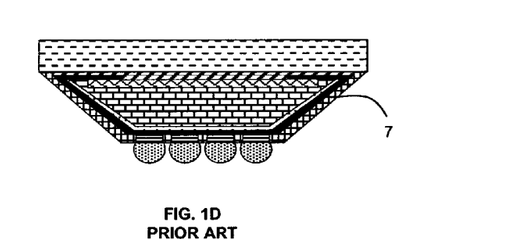
Figure 1F:
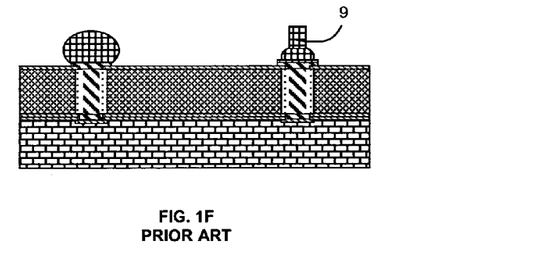

Referring to FIG. 1A-1F, different configurations are shown of prior wafer level package and chip scale packages of IC devices. FIG. 1A-1F show typical IC devices that are fabricated in conventional wafer level configurations. For example the IC wafer level package devices that are shown in FIG. 1A-1F have interconnects formed after wafer configuration. FIG. 1A shows solder interconnects 4 formed after layers 3 of functional devices and I/O 2 are formed on a wafer substrate 1. FIG. 1B shows holes 5 with conductive material that are processed for the I/O. FIG. 1C shows three dimensional connector for internally connecting backside with drilling to connect I/O pad. FIG. 1D shows I/O connector 7 along side wall after device fabrication. FIG. 1E shows holes processed like holes shown in FIG. 1B to connect I/O pad 8. FIG. 1F shows holes processed like holes shown in FIG. 1B with solder ball and wire bonding 9. Each individual device is packaged while the devices are still available in wafer form, prior to the wafer dicing process to obtain chip sized package. Many packaging process steps are added directly on a device wafer to realize these chip sized packages, which are of small form factor and reduced weight. However, the resulting IC device that is fabricated by the conventional processes is limited by I/O density as the chip size determines the package I/O density.

For example, U.S. Pat. Nos. 6,040,235 and 6,117,707 disclose two processes that are conventional. U.S. Pat. No. 6,040,235 discloses an IC device having a footprint approximately the size of a die of the IC device. The steps for manufacturing the IC device in such a conventional process includes providing a wafer that includes multiple dies wherein each die includes multiple connection pads; sandwiching the wafer between two protective layers; cutting notches through one of the protective layers along outlines of the dies to expose portions of the connection pads; forming metal contacts on the surface of the notched protective layer that are electrically connected to the exposed portions of the connection pads; and separating the dies to form individual dies. The step of cutting notches is sequential and therefore is time-consuming, and also requires an accurate fixed angular shaped cutting blade for cutting the notches. As cutting produces debris, the cutting step has to be performed outside of a clean room to prevent contamination and damage of the device. A cut wafer is then transported into the clean room for further processing, making handling of the wafer cumbersome. Additionally, the two protective layers on a resultant die also increase the cost of fabrication.

U.S. Pat. No. 6,117,707 discloses another IC device having multiple dies similar to that disclosed in U.S. Pat. No. 6,040,235. The dies are arranged in a stacked configuration. Interconnections between the dies of such an IC device are formed only after the stacks of dies are separated to form individualized IC devices. Accordingly, the process of interconnecting the dies in a device is performed on a device level and increases fabrication time.

The conventional fabricating methods disclose packaging/interconnection of the device IOs to the external system after the devices are pre-fabricated, which limits the number of IOs and functionality of device per square of silicon area. Also additional processes and packaging are required for routing of the interconnection lines across or within the chip to the IOs located peripherally around the chip to enable external interconnections. It is well known in the art of semiconductor industry that handling of devices once it is fabricated is a critical step. Risk involved in loosing wafer yields is highly dependent on the amount of handling and process stages the device wafer undergoes after the wafer reaches packaging and assembly houses.

Such conventional fabrication methods typically require additional device packaging methods after the devices are fabricated at the semiconductor wafer fabrication facilities which results in exposing the processed device to increased risk of contamination and damage. Therefore, there is a need for a method of fabricating a functional IC device that alleviates the problems associated with prior fabrication methods.

SUMMARY

An aspect of the invention provides a method of fabricating a wafer level integration module with interconnects comprising providing a wafer having a first side and a second side; forming depressions in the first side of the wafer; depositing a first insulation layer on the first side of the wafer; depositing a first conductive layer on the insulation layer, the first conductive layer having a first side and a second side; depositing a second insulation layer on the first side of the conductive layer; exposing the first conductive layer; fabricating a semiconductor functional device on the first side of the wafer; exposing from the second side of the wafer, the second side of the first conductive layer; depositing a third insulation layer on the exposed second side of the first conductive layer; patterning the third insulation layer and exposing portions of the first conductive layer; depositing a second conductive layer on the patterned third insulation layer; and exposing second layer conductive layer for contact with external devices.

In an embodiment the depressions form microstructures. The conductive layer is a high temperature conductive film. The conductive interconnect film may be exposed by chemical mechanical polishing. A substrate may be provided and attached to the first side of conductive interconnect film to protect the first side of the wafer. A conductive material may be deposited to the second layer conductive layer for contact with external devices.

In an embodiment the semiconductor functional device may comprise depositing additional layers forming the functional device. The additional layers may form a plurality of functional devices. The additional layers may be formed in a stack formation. The plurality of dies may be formed on the wafer. The dies may be separated along separation zones the plurality of dies. The functional device may be a transistor and the plurality of functional devices may be transistors.

In an embodiment the functionality of the semiconductor device may be tested after fabrication of the device tested. The testing of the semiconductor device comprises forming test pads on the first side of the wafer. The test pads may be removed after testing and before fabrication of a subsequent device. A fourth insulation layer may be deposited to protect the second conductive layer.

BRIEF DESCRIPTION OF THE DRAWINGS

In order that embodiments of the invention may be fully and more clearly understood by way of non-limitative example from the following description taken in conjunction with the accompanying drawings in which like reference numerals designate similar or corresponding elements, regions and portions, and in which:

FIG. 1A-1F shows different configurations of prior wafer level package and chip scale packages of IC devices.

DETAILED DESCRIPTION

According to an embodiment of the present invention, there is provided a method 200 of manufacturing an integrated circuit (IC) device 90. According to the method, a wafer 10 is first provided having a first or top surface and a second or bottom surface. The wafer may be a blank polished or unpolished silicon wafer or the like. High aspect ratio micro-structures 16 that are specifically designed to provide a die level interconnect configuration and mapping, are provided on the first blank surface 12 of the wafer. The wafer with pre-formed conductive interconnect microstructures 16 are further processed for device fabrication, for example, at the wafer fabrication facilities. Once the front side 12 devices are fabricated, the silicon material 20 is then removed from a second side 14 of the device wafer 10, opposite the first side, to expose the high temperature conductive interconnect microstructures 16. Contacts are formed on the second side of the device wafer using conductive metal. These contacts are electrically connected to the interior of the microstructures and thereby electrically connect with the functional device 26. The dies 90(1),90(2) are separated along the separation zones 88 between the dies to produce individualized functional and packaged dies, each of which serves as a fully packaged IC device 90. Embodiments of the invention calls for a predetermined I/O pad distribution on the raw silicon wafer prior to the device fabrication process is started. A high temperature conductive interconnect film is deposited on a raw silicon wafer with necessary dielectric insulation components to prevent electrical current leakage and circuit shorting to silicon substrate in use. Once the interconnections are made, the device under application is fabricated and the wafer further processed for interconnecting the same to the external printed circuit board. where the packaging interconnections are pre-formed on the blank wafer first prior to packaging.

A method and apparatus for manufacturing an integrated circuit (IC) device 90 is disclosed. A wafer 10 is first provided having a first or top surface and a second or bottom surface. The wafer may be a blank polished or unpolished silicon wafer or the like. High aspect ratio micro-structures 16 that are specifically designed to provide a die level interconnect configuration and mapping, are provided on the first blank surface 12 of the wafer. The wafer with pre-formed conductive interconnect microstructures 16 are further processed for device fabrication, for example, at the wafer fabrication facilities. Once the front side 12 devices are fabricated, the silicon material 20 is then removed from a second side 14 of the device wafer 10, opposite the first side, to expose the high temperature conductive interconnect microstructures 16. Contacts are formed on the second side of the device wafer using conductive metal. These contacts are electrically connected to the interior of the microstructures and thereby electrically connect with the functional device 26. The dies 90(1), 90(2) are separated along the separation zones 88 between the dies to produce individualized functional and packaged dies, each of which serves as a fully packaged IC device 90.

Figure 2A:
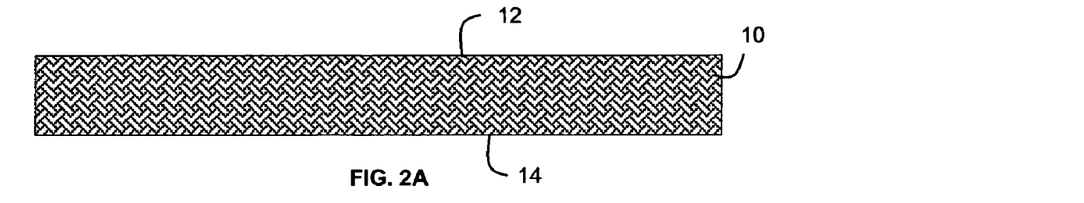
FIG. 2A-2R shows a cross-sectional view of a silicon wafer during processing steps of fabricating a functional IC device on a silicon wafer in accordance with an embodiment of the invention.
Figure 2B:
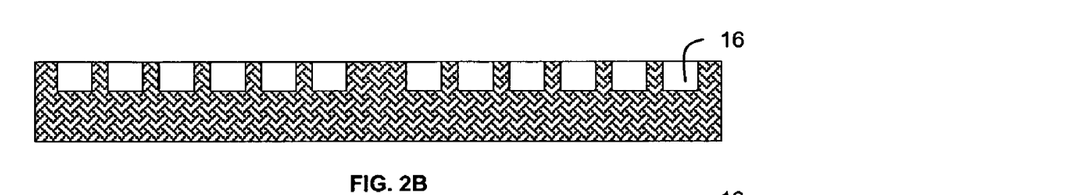
Figure 2C:
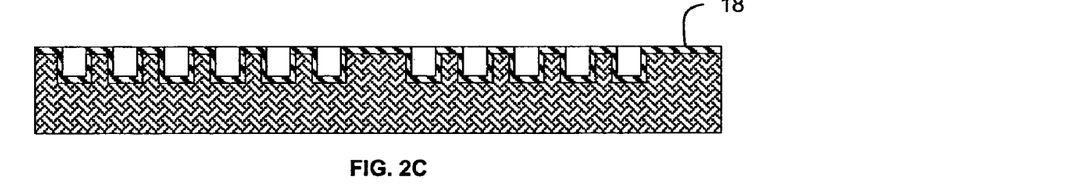
Figure 2D:
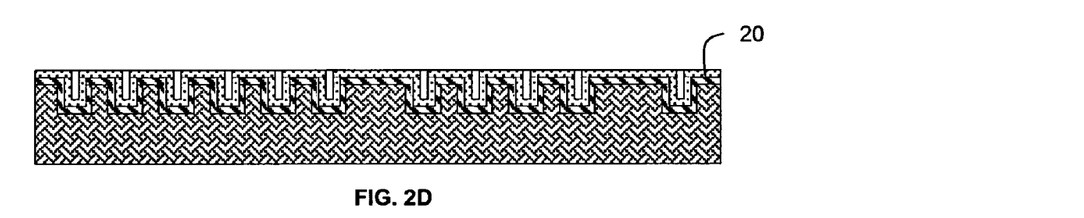
Figure 2E:
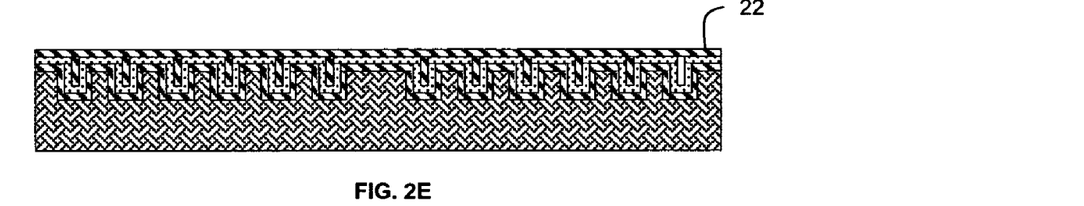
Figure 2F:
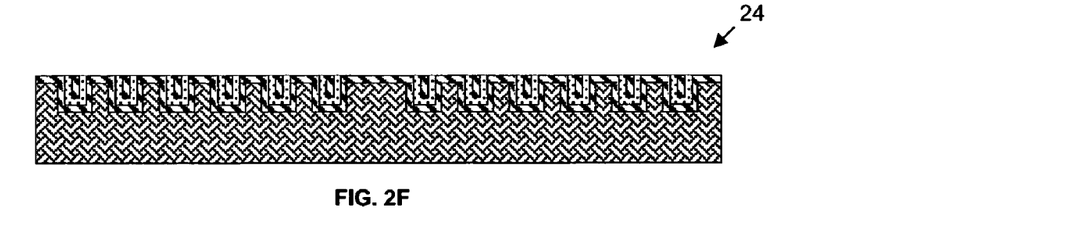
Figure 2G:
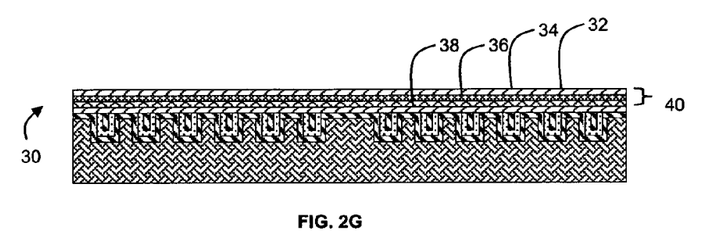
Figure 2H:
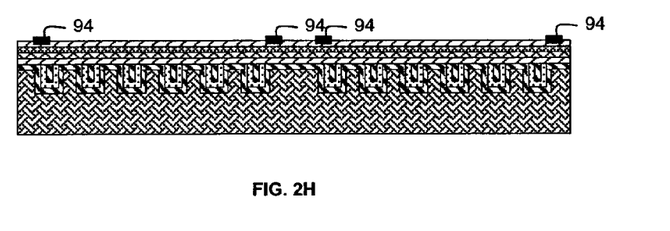
Figure 2I:
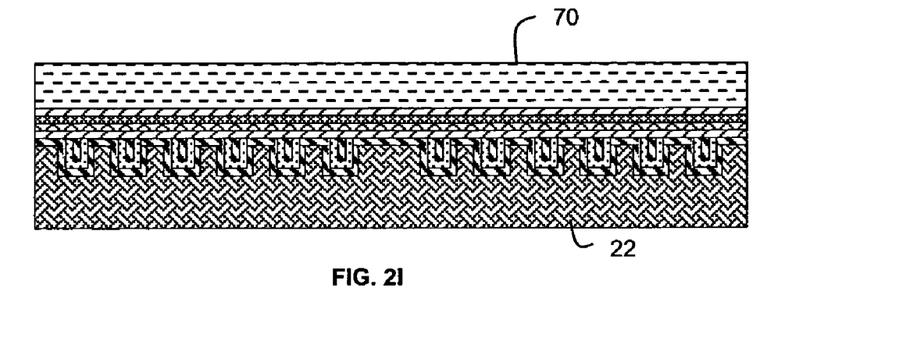
Figure 2J:
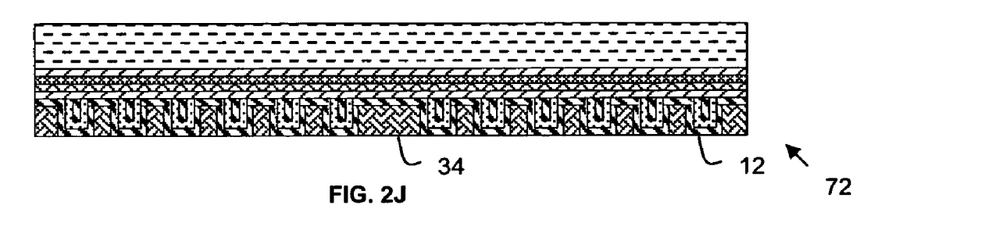
Figure 2K:
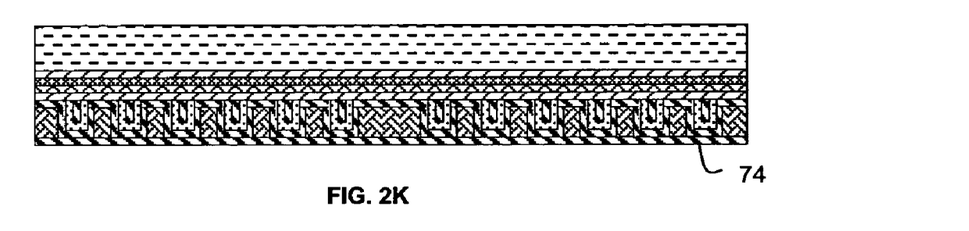
Figure 2L:
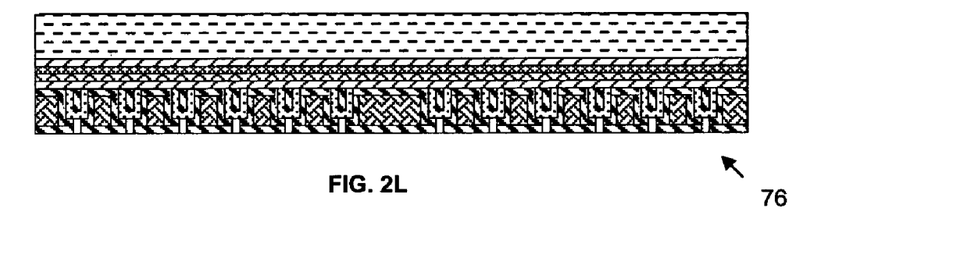
Figure 2M:
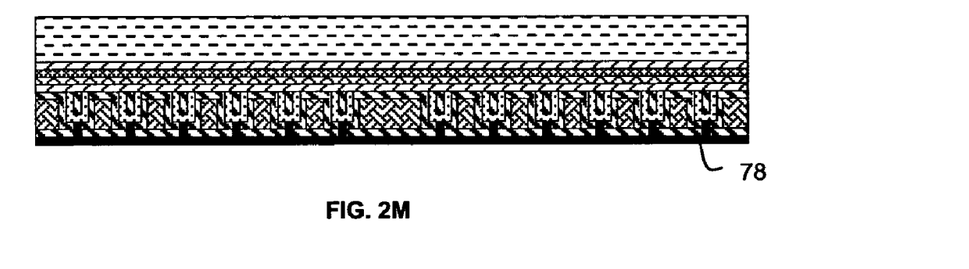
Figure 2N:
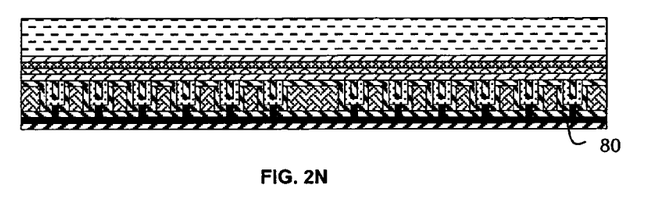
Figure 2O:
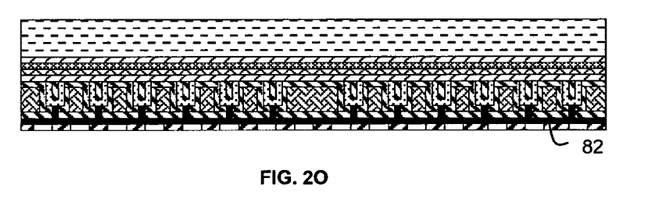
Figure 2P:
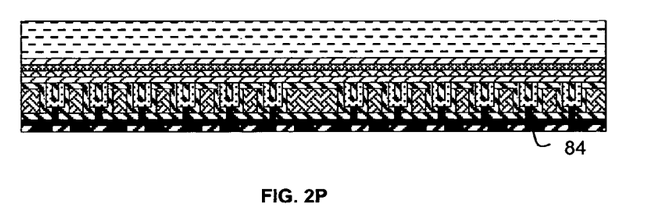
Figure 2Q:
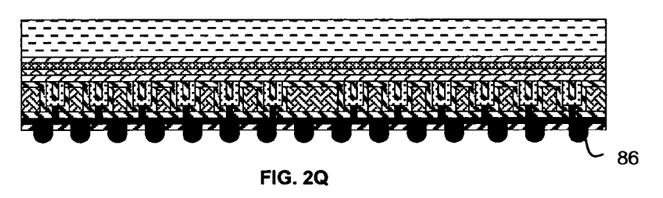
Figure 2R:
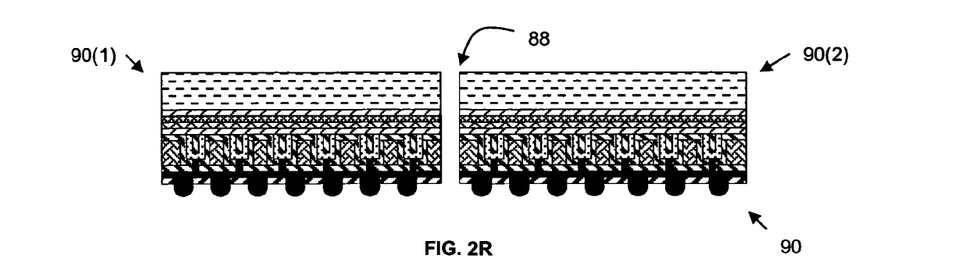

With reference to FIG. 2A-2R, a cross-sectional view of a silicon wafer during processing steps of fabricating a functional IC device on a silicon wafer in accordance with an embodiment of the invention. FIG. 2A is a schematic cross section of a blank silicon wafer 12, which may be polished, unpolished, P-type, N-type, having a desired orientation for each application, or the like. It will be appreciated that other wafers would be suitable, such as for example a galium arsenide wafer, gallium indium wafer, germanium wafer, and the like. FIG. 2B shows the wafer 12 with microstructures 16 formed for the purpose of interconnections for the device under fabrication.

The microstructures may have a dimension that is suitable for the specific application, for example, the microstructures may have an opening (X,Y) geometry of 0.5 µm (micron), and a depth of 10 µm (micron) which may be, for example, a minimum in an embodiment. The microstructures may be formed using any silicon removal method that is known in the art of semiconductor industry. FIG. 2C shows the wafer with insulated, passivated layer 18. The passivation layer 18 may be a material such as SiO2, SiN, or the like. The passivation layer on the microstructures is to isolate the silicon walls of the microstructures from the conductive interconnect films/materials 20 shown in FIG. 2D. The deposition of the passivation/insulation materials 18 may be performed using processes that are known in the art of semiconductor industry. The wafer is deposited with a conductive interconnect film 20 such as a high temperature interconnect film or material, or the like that is deposited at the microstructure walls for the purpose of providing interconnections with device under fabrication. These conductive films or materials 20 are deposited using methods that are known in the art of semiconductor industry. Doped conductive polysilicon or the like may be the material for electrical conductivity. FIG. 2E shows the wafer with a final passivation or insulation layer 22 that is deposited to protect the conductive interconnect films at the microstructures that are pre-formed for the purpose of interconnections with device under fabrication. The passivation layer 22 may be a material such as SiO2, SiN, or the like. It will be appreciated that in this embodiment the final passivation layer is to protect and provide additional protection of the underlying structures, however, in other embodiments since an oxide may form naturally over the polysilicon without any additional steps which acts to protect, the deposition of the passivation layer 22 may not be necessary.

FIG. 2F shows the processed wafer 24 after the removal of excess passivation films or materials 22 and excess conductive films or materials 20 that are deposited on the first side of the blank wafer 10 to expose the high temperature conductive interconnect film microstructures. The excess films or materials are removed by processes that are known in the art of semiconductor industry.

FIG. 2G shows the processed wafer 30 after at least one functional device is fabricated by layers 40. In this embodiment, the functional device shown is a transistor, however it will be appreciated that the functional device may be configured differently and take different forms. For example the functional device may be transistors, resistors, capacitors, inductors, micro electro mechanical systems (MEMS), surface acoustic wave (SAW) devices, or the like. The layers 40 of the functional device are fabricated over the pre-formed microstructures 24. The number of layers, for example layers 38,36,34,32 shown for the transistor example, depend on the type of device fabricated and the particular device design and in accordance with process guide lines. For example, the transistor devices are internally interconnected with the interconnection contacts located at the pre-formed microstructures of the wafers. The transistor device fabrication may be carried out at the wafer and device fabrication facilities. FIG. 2H shows test pads 94 formed on the front side of the wafer. The functionality of the fabricated device may be tested by providing corresponding test pads 94 on the front side of the wafers. The test pads may be a metal and formed in conventional manner. In an embodiment, after testing the functionality of the device the test pads may be removed, in particular if another device is to be fabricated on top of the tested device, since the metal of the test pads may not withstand the high temperatures in the fabrication process of the next device.

FIG. 2I shows the processed wafer that is attached with another substrate 70 on the front side of the silicon wafer to cover the functional device. The substrate 70 protects the functional device that has been fabricated on the front side from the handling, environment and other hazards that may damage the functional device. The protection substrate that is used on the first side of the device wafers could be of silicon, ceramic, glass, plastic molded or any substrate that is suitable for use in semiconductor device applications.

FIG. 2J shows the processed silicon wafer after the removal of excess silicon materials from the second side of the wafer, to expose the insulation or passivation films 18 that are deposited at the pre-formed microstructures on the front side of the wafer. The passivation film material exposed may be $SiO_2$, SiN, or the like as discussed. The silicon removal processes is any suitable process that is well known in the art of semiconductor industry. In FIG. 2K, the processed silicon wafer after the deposition of new insulation/passivation films 74 on the second side of the silicon wafer to match and merge with the exposed insulation/passivation films 74 on the second side of the silicon device wafer. These films will ensure complete insulation of exposed silicon on the planar surface of the second side of the silicon wafer. In FIG. 2L the processed wafer is shown after patterning 76 and removal of insulation/passivation films to expose the high temperature conductive interconnection films 20 at the pre-formed microstructures from the second side of the wafer. FIG. 2M shows the processed wafer after the deposition of conductive interconnect films 78 at the second side of the silicon wafer to enable interconnections from the active devices to the second side of the silicon wafer. The conductive interconnect films may be a conductive material such as TiNi, Al, Cu, Au, and the like. FIG. 2N shows the processed wafer after the deposition of insulation/passivation films 80 at the planar surface of the second side to protect the interconnect films that form the interconnection between the active device to the external assemblies. Such insulation/passivation films may be materials such as $SiO_2$, SiN, PI, BCB and the like. FIG. 2O shows the processed wafer after the opening of insulation/passivation film via 82 to expose the interconnect films that form the part of interconnection channels with the active devices. FIG. 2P shows the processed wafer after the suitable conductive materials or films 84 that are deposited at the exposed inner interconnect films at the passivation/insulation opened via, to facilitate the board level interconnections during the external assemblies. FIG. 2Q shows the processed wafer after the deposition of solder materials 86 at the I/O bond pads to facilitate assembly of the device to the external circuit boards.

In FIG. 2R a schematic cross section of the processed wafer after the dicing of the arrayed devices 90(1 ... n) to separate each device that has been interconnected to the corresponding I/O at the planar surface of the second side of the device.

Figures 3A, 3B:
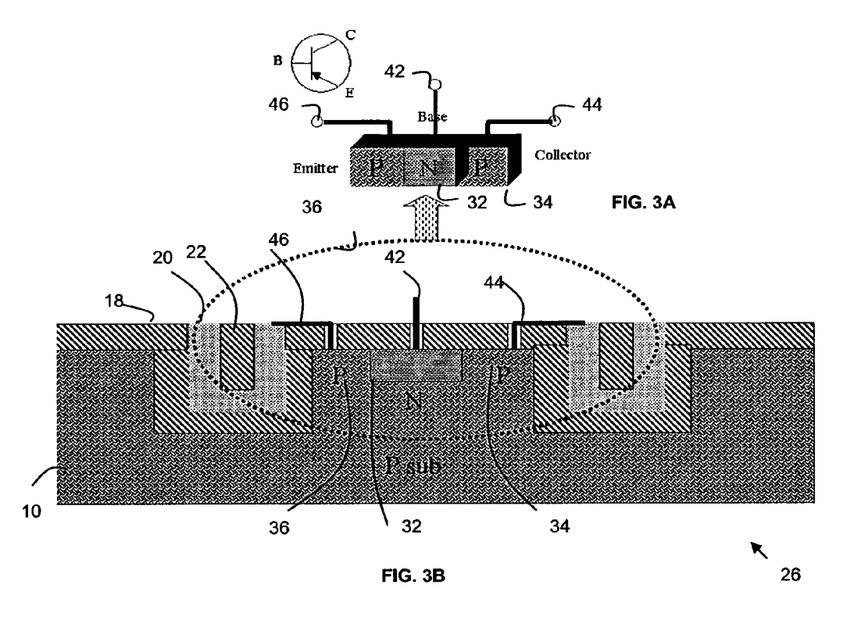
FIG. 3A-3B shows a cross-sectional view of the processed silicon wafer of FIG. 2A-2R showing fabrication of a functional IC device such as a transistor device in accordance with an embodiment of the invention.
Figure 4A:
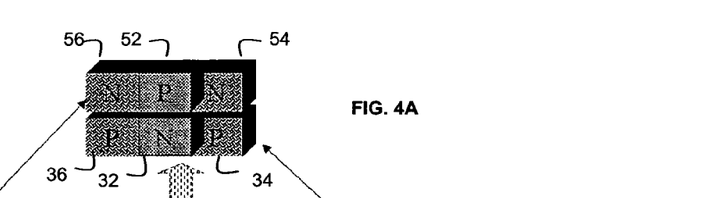
FIG. 4A-B shows a cross-sectional view of the processed silicon wafer of FIG. 2A-2R showing fabrication of two functional IC devices such as two transistor devices in accordance with an embodiment of the invention.
Figure 4B:
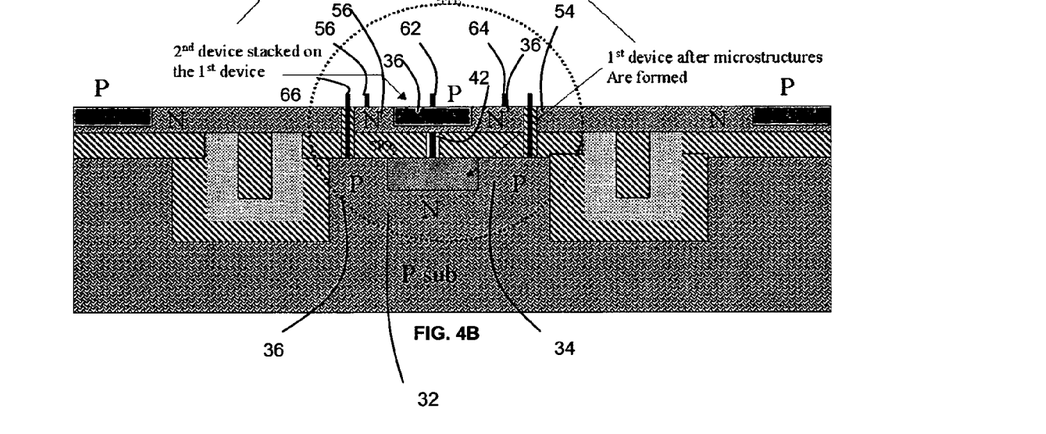
Figure 5:
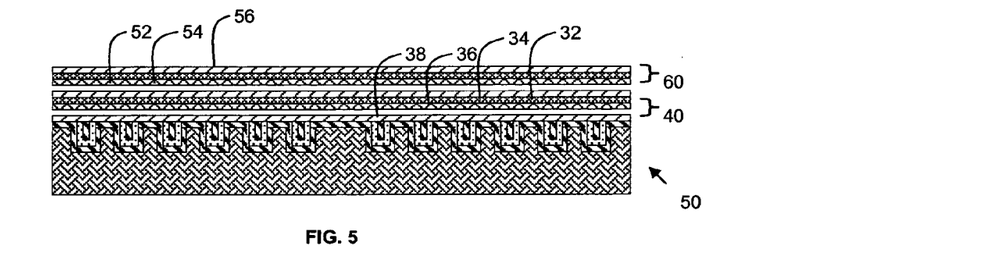
FIG. 5-7 shows cross-sectional views of a processed silicon wafer of FIG. 2A-2R with multiple layers of functional IC devices.
Figure 6:
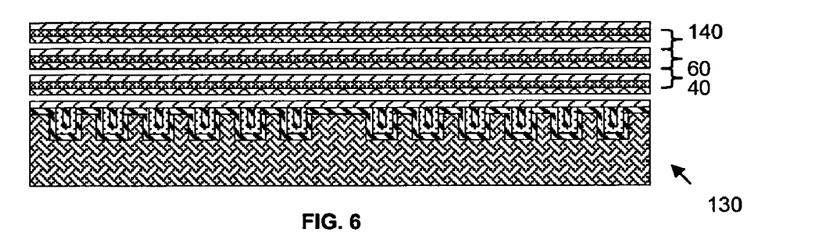
Figure 7:
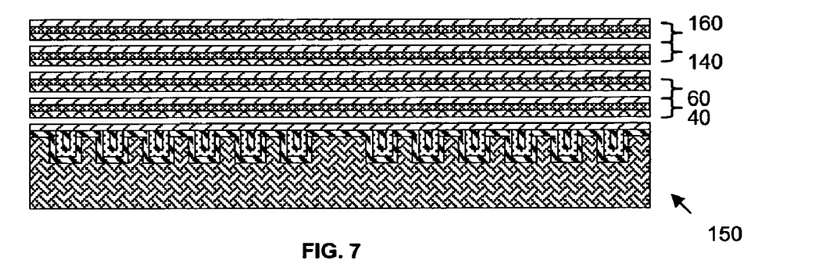

FIG. 5-7 shows cross-sectional views of a processed silicon wafer of FIG. 2A-2R with multiple layers of functional IC devices. FIG. 3A-3B shows a cross-sectional view of the processed silicon wafer of FIG. 2A-2R showing fabrication of a functional IC device such as a transistor device in accordance with an embodiment of the invention in greater detail than in FIG. 2G. FIG. 4A-B shows a cross-sectional view of the processed silicon wafer of FIG. 2A-2R showing fabrication of two functional IC devices such as two transistor devices in accordance with an embodiment of the invention in more detail than shown in FIG. 5. FIG. 6 and FIG. 7 show three and four functional IC devices, respectively, in accordance with embodiments of the invention. It will be appreciated that any number of functional devices may be configured in stack configuration. Three dimensional stack devices 50, 130, 150 can be fabricated using this interconnect microstructure base wafer. Each device that may be same or different can be fabricated by deposition a layer of epitaxial silicon films 40,60,140,160 over the previously fabricated device and wafer. Thereby multiple functional devices in stack form are realized before the pre-formed microstructure wafer is processed for backside interconnections. The functionality of each single layer device and devices may be tested for functionality by depositing and patterning metal layers at the test pad locations and later removing the test pads prior to the second level devices are stacked and fabricated on the devices tested.

Figure 8A:
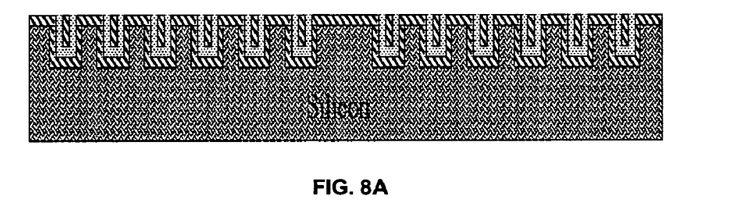
FIG. 8A-C shows cross-sectional views of a processed silicon wafer during processing steps of fabricating a silicon on insulation (SOI) structure in accordance with an embodiment of the invention.
Figure 8B:
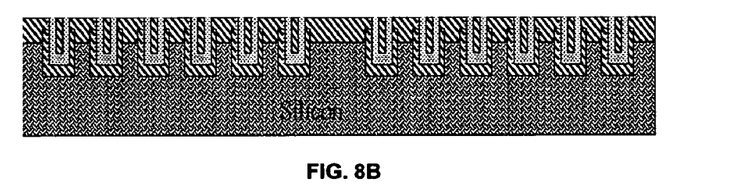
Figure 8C:
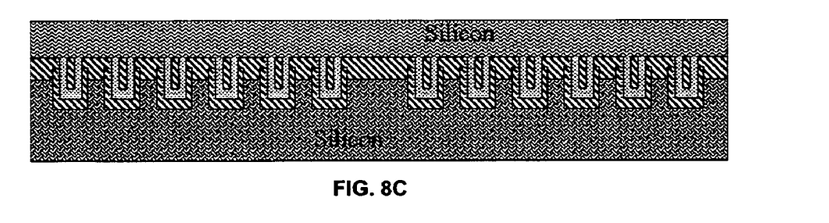

Embodiments of the invention may be configured in a silicon on insulation (SOI) structure after the microstructures are fabricated, as shown in FIG. 8A-C. This is formed by depositing a thin layer of silicon on the already deposited and exposed oxide or insulation thin films, giving rise to SOI structures of material such as SiO2 and the like. The SOI substrate is fabricated first on the pre-formed microstructures and later the devices are fabricated.

Figure 9:
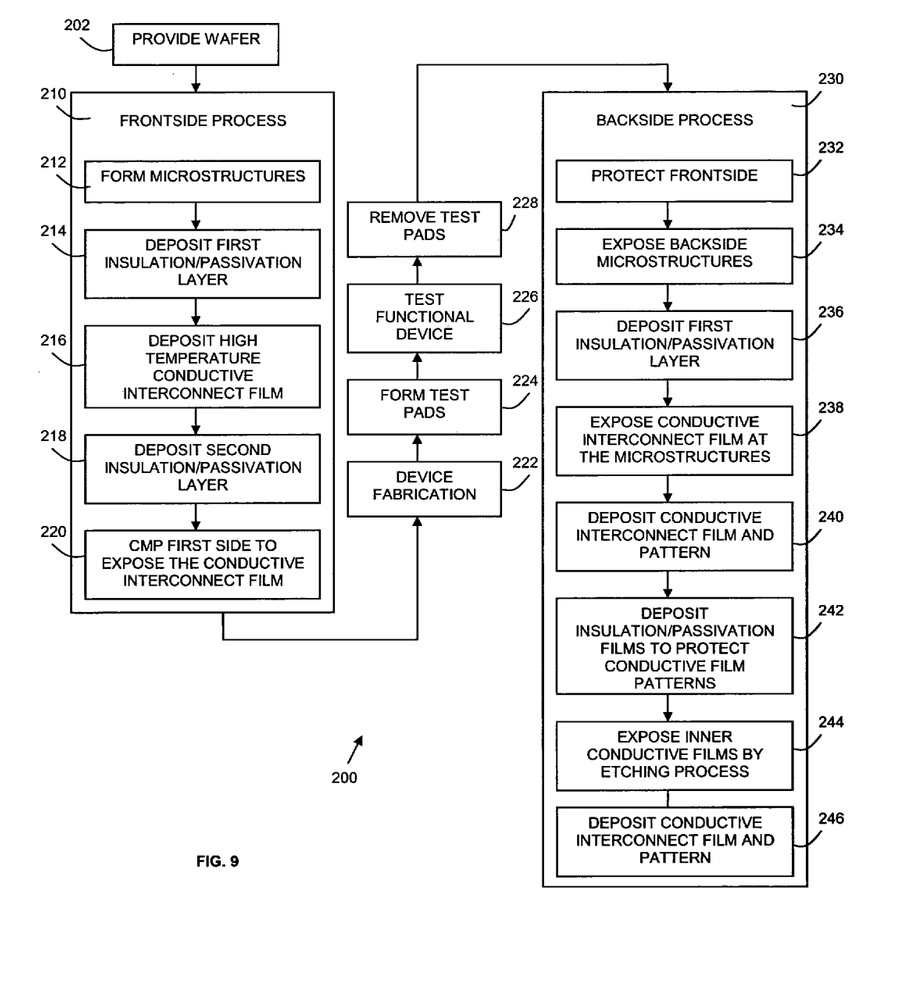
FIG. 9 shows a flow chart of the processing steps of a method of fabricating a functional IC in accordance with an embodiment of the invention.

A method 200 of the invention in accordance with an embodiment is shown in the flow chart of FIG. 9. The steps of front side process 210 and back side process 230 are shown on a wafer provided 202. The front side process comprises forming microstructures 210 and then deposition of an insulation layer 214, conductive interconnect film 216, such as high temperature conductive film, and second insulation layer 218. The conductive interconnect film is exposed 220 by for example chemical mechanical polishing (CMP). The fabrication of the functional device is performed 222. After device fabrication, the backside of the wafer is processed 230. The back side process comprises protecting the frontside by attaching another substrate 232, and exposing the backside microstructures 234. An insulation or passivation layer is deposited 236 and the conductive interconnect layer is exposed 238. Conductive interconnect film is deposited 240 for example patterned on the exposed interconnect film at the microstructures. Insulation or passivation film is deposited 242 to protect the conductive interconnect film. Inner conductive films are exposed 244 by for example etching process. Conductive material is deposited 246 for facilitating connection of the functional IC device to external circuitry. In an embodiment, after the device fabrication 222 and before the backside process, the functionality of the functional device may be tested 224,226. Test pads may be formed 224 on the front side of the wafer and the device may be tested 226. In an embodiment, in particular if another device is to be fabricated on the tested device, the test pads may be removed 228 after testing the functionality of the device since the material of the test pads may not withstand the high temperatures in the fabrication process of the next device. It will be appreciated another device may be fabricated, and any number of devices may be fabricated 222 accordingly, prior to the backside process 230.

Embodiments of the invention, the interconnect microstructures are formed first on the blank silicon wafer, and then the device is fabricated over the preformed interconnect microstructures. With this configuration, the device design may be optimized with minimal routing and ease of design while minimizing noise, maximizing device speed, and maximizing I/O pad flexibility. Additionally, the device configuration allows more functionality for reduced silicon area which results in minimized silicon cost since no peripheral bond pads are required. This allows for minimizing size of devices and silicon costs as the scribe line geometry is minimized. The functional space for the devices or more chips per wafer are maximized which also minimizes cost. As no bond pads are exposed, there are no atmospheric corrosion issues, which increase device reliability. Additionally, as no three-dimensional channels at the backside of the device are required, no thin film stress related to the three dimensional films is introduced.

Embodiments of the invention may be adapted to any device of interest and no limitations are envisaged. The thickness of the devices may be minimized, for example in the order of 10 to 50 micron with minimal interconnect channels resulting in maximized device speed, and minimized overall form factors. This approach allows fabrication of build up layers using multi layer metal, passivation layers at the back side of the device within the wafer fabrication facilities, which minimizes risk of wafer damage or contamination. This results in increased wafer yields as no handling or assembly processes are carried out on the processed wafers. Embodiments of the invention allows pre-fabrication of standard gate I/O microstructures on the wafers prior to the device fabrication, allowing a flexibility to design and use only the required I/O microstructures for designs such as gate array metal interconnects that are popular in ASIC device fabrication. Multiple devices using same or different functions can be processed on top of each previously fabricated device wafer in stack format using an epitaxial silicon intermediate film, if required. Required I/Os may also be processed as an integral part of the device fabrication that may facilitate the multiple stack die interconnections to the second side of the active device wafer.

Embodiments of the present invention virtually eliminates the packaging and assembly activities for the devices as the interconnections are carried out prior to the device fabrication during the wafer fabrication process at the wafer fabs. Embodiments of the invention offer advantages such as elimination of the requirement of bond pads at the peripheral of the devices. This gives rise to reduced silicon area and more functionality on a given silicon size, thus reducing the silicon cost. Another advantage is that circuitry for interconnection of the IOs with in the chip is minimized, which improves speed of the device and contributes to minimizing in interconnect routing noise. This contributes to the overall improvement on performance of the devices. Additionally, since no packaging such as die bonding, wire bonding, and the like is required, the cost on packaging is completely eliminated. As the I/O are predetermined before the devices are fabricated, there is no limitation on the I/O pitch with in the chip and hence high density interconnect chips can be fabricated using this process. An embodiment of the invention allows all the primary interconnections and test pads to be located within the chip without running any interconnect lines to device peripherals. Since no peripheral bond pads are involved in embodiments of invention, the scribe lines can be minimized, such as for example down to as small as 20 to 30 micron, which will allow additional silicon for additional device accommodation, thus further reducing the cost of silicon per device. The resulting reduction in street between the devices fits well into the existing laser dicing processes with optimal silicon scribe areas.

While embodiments of the invention have been described and illustrated, it will be understood by those skilled in the technology concerned that many variations or modifications in details of design or construction may be made without departing from the present invention.

The invention claimed is:

1. A method of fabricating a wafer level integration module with interconnects comprising:
   providing a wafer having a first side and a second side;
   forming depressions in the first side of the wafer;
   depositing a first insulation layer on the first side of the wafer;
   depositing a first conductive layer on the insulation layer, the first conductive layer having a first side and a second side;
   depositing a second insulation layer on the first side of the first conductive layer;

exposing the first conductive layer;

fabricating a semiconductor functional device on the first side of the wafer;

exposing from the second side of the wafer, the second side of the first conductive layer;

depositing a third insulation layer on the exposed second side of the first conductive layer;

patterning the third insulation layer and exposing portions of the first conductive layer;

depositing a second conductive layer on the patterned third insulation layer; and exposing the second conductive layer for contact with external devices.

2. The method of claim 1 wherein the depressions form microstructures.

3. The method of claim 1 wherein the first conductive layer is a high temperature conductive film.

4. The method of claim 3 wherein the conductive film is exposed by chemical mechanical polishing.

5. The method of claim 3 further comprising providing a substrate to the first side of the conductive film to protect the first side of the wafer.

6. The method of claim 1 further comprising depositing conductive material to the second conductive layer for contact with external devices.

7. The method of claim 1 wherein the step of fabricating the semiconductor functional device comprises depositing additional layers forming the functional device.

8. The method of claim 7 wherein the additional layers form a plurality of functional devices.

9. The method of claim 8 wherein the additional layers are formed in a stack formation.

10. The method of claim 1 wherein a plurality of dies are formed on the wafer.

11. The method of claim 10 further comprising separating along separation zones the plurality of dies.

12. The method of claim 7 wherein the functional device is a transistor.

13. The method of claim 8 wherein the plurality of functional devices are transistors.

14. The method of claim 1 further comprising testing the semiconductor device after fabrication.

15. The method of claim 14 wherein the step of testing the semiconductor device comprises forming test pads on the first side of the wafer.

16. The method of claim 15 further comprising removing the test pads after testing and before fabrication of a subsequent device.

17. The method of claim 1 further comprising depositing a fourth insulation layer to protect the second conductive layer.

* * * * *